United States Patent [19]

Ramm et al.

[11] Patent Number: 5,308,950
[45] Date of Patent: May 3, 1994

[54] METHOD OF REMOVING MATERIAL FROM A SURFACE IN A VACUUM CHAMBER

[75] Inventors: Jürgen Ramm, Fläsch, Switzerland; Eugen Beck, Triesenberg; Albert Zueger, Schaan, both of Liechtenstein

[73] Assignee: Balzers Aktiengesellschaft, Balzers, Liechtenstein

[21] Appl. No.: 870,945

[22] Filed: Apr. 20, 1992

[30] Foreign Application Priority Data

Apr. 23, 1991 [CH] Switzerland .................. 01215/91

[51] Int. Cl.⁵ .................................. B23K 9/00
[52] U.S. Cl. ...................... 219/121.43; 219/121.4 X; 156/345; 156/646; 204/298.34
[58] Field of Search ............... 219/121.430, 121.440, 219/10.55 A, 10.55 R; 156/345, 646, 643; 204/298.17, 298.34, 298.38, 298.15, 298.31

[56] References Cited

U.S. PATENT DOCUMENTS

| | | | |
|---|---|---|---|
| 4,122,292 | 10/1978 | Karinsky | 219/121.43 |
| 4,123,316 | 10/1978 | Tsuchimoto | 156/643 |
| 4,277,304 | 7/1981 | Horiike et al. | 156/643 |
| 4,574,179 | 3/1986 | Masuzawa et al. | 219/121.43 |
| 4,664,747 | 5/1987 | Sekigucyi et al. | 156/643 |

FOREIGN PATENT DOCUMENTS

| | | |
|---|---|---|
| 0282467 | 9/1988 | European Pat. Off. . |
| 0371693 | 6/1990 | European Pat. Off. . |
| 55-110771 | 8/1980 | Japan . |
| 1287288 | 11/1989 | Japan . |
| 2156066 | 6/1990 | Japan . |

OTHER PUBLICATIONS

"In situ removal native oxide from silicon wafers", Sherman, *J. Vac. Sci. Technol.* Jul./Aug. 1990; pp. 656-657.

*Primary Examiner*—Mark H. Paschall
*Attorney, Agent, or Firm*—Notaro & Michalos

[57] ABSTRACT

In order to remove material from the surfaces in a vacuum chamber it is proposed to activate hydrogen gas in a plasma with the aid of a low voltage arc discharge which is supported by a hot emitting electrode in a cathode chamber. The removing method allows the cleaning of surfaces onto which subsequently safely adhering layers of a highest purity can be precipitated. The method can also be used for cleaning vacuum chambers. The small expenditures regarding apparatuses with the high rates of removal to be obtained produce a highly economical practicing of the method.

14 Claims, 1 Drawing Sheet

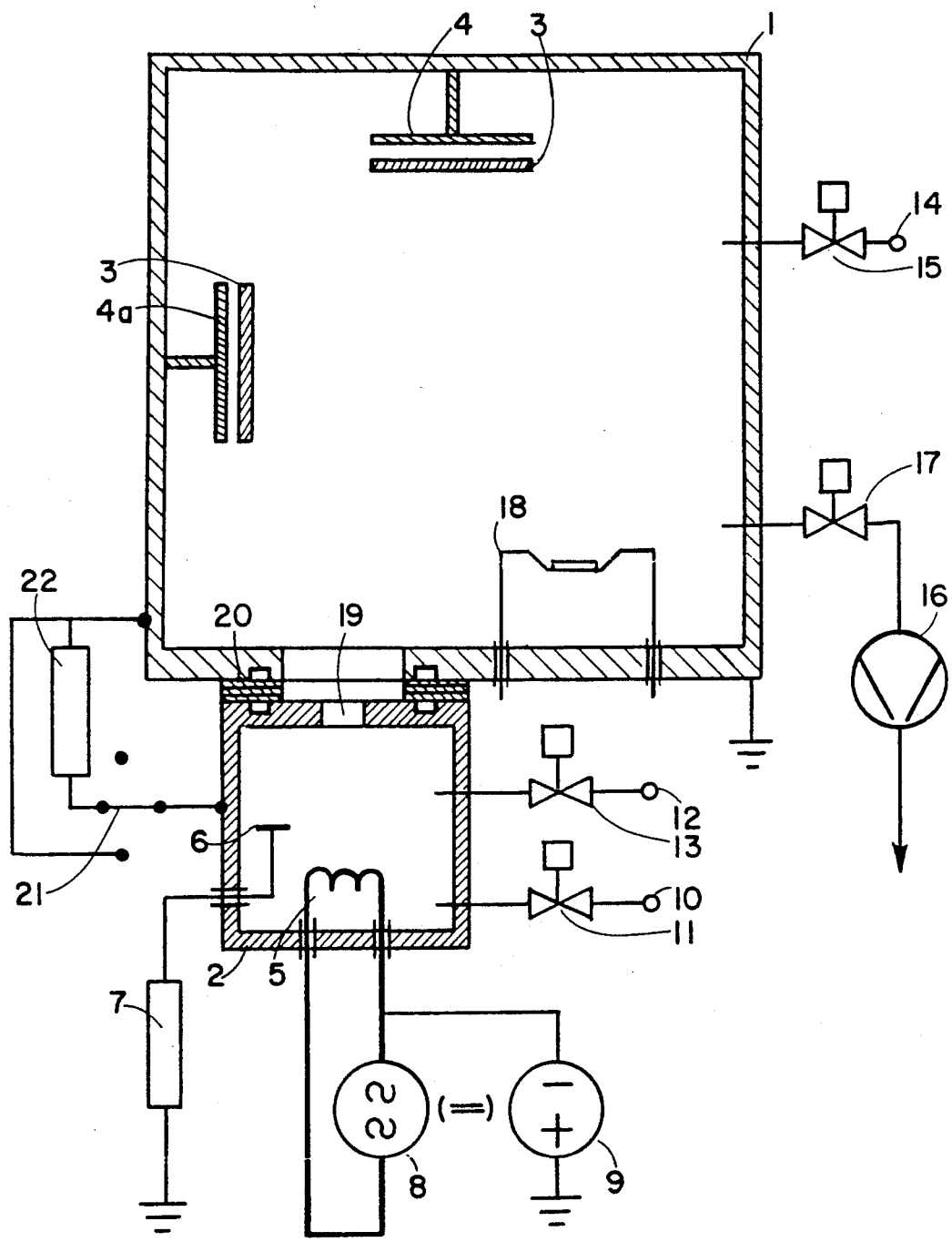

METHOD OF REMOVING MATERIAL FROM A SURFACE IN A VACUUM CHAMBER

BACKGROUND OF THE INVENTION

1. Field of the Invention

The present invention relates to a method of removing material from a surface in a vacuum chamber by using plasma-activated hydrogen.

When coating workpieces it is for instance often necessary to subject the support for the workpiece to a cleaning process prior to the coating in order to be in a position to precipitate thereafter the coating to be deposited with a high adherent strength Such a method is applied in all such cases where workpieces are to be coated by means of a vacuum process such as for a coating of semiconductor circuits or for instance tools. Further applications of the method encompass the removal of contaminations not only from the workpieces but also from the vacuum chamber itself. The field of such a cleaning procedure covers the removal of contaminations consisting of oxides, carbon and also carbon compositions whereby the chemical reactivity of the hydrogen is utilized.

2. Description of the Prior Art

Known cleaning methods for workpieces are for instance plasma etching processes and atomizing etching processes. When the above mentioned methods involve high etching rates, it is possible that temperatures of several 100° Celsius are encountered at the workpiece. In many cases such high temperature values are not suitable for the workpiece. Additionally, relative high energy values of the particles by means of which the workpiece is treated in the range of several 100 electron volts are encountered. Apart from the high thermal loading such can lead to a change or to defects, in the surface structure of the workpiece. A further drawback of the known methods is that the etching process itself can cause a contamination of the workpiece by a recoating. By means of the known methods highest demands of purity can thus be achieved only within limits In order to circumnavigate these drawbacks and to be in a position to use a more protective etching process it has been proposed to etch silicon dioxide by means of activated hydrogen such as disclosed in the publication of Arthur Sherman "In situ removal of native oxide from silicon wafers", technical journal J. Vac. Sci. Technol. B 8 (4), July/August 1990, page 656. According to this publication it is proposed to activate the hydrogen in a hollow cathode discharge at a discharge voltage of 600 Volts and a discharge current of 100 milli-amps. The there proposed arrangement does, however, not completely solve the above mentioned problems because the high electron energy of about 600 volts can lead to defects of the surface structure and to a re-coating by sputtering processes. A further technical publication of Y. Kunitsugun I. Suemune "Low temperature cleaning of Si and growth, of GaAs on Si by hydrogen plasma assisted metallorganic molecular beam epitaxy" of Journal of Crystal Growth 95 (1989) 91-95 North-Holland, Amsterdam discloses a further etching method for silicon and gallium arsenide surfaces, which operates with activated hydrogen, whereby here the activation of the hydrogen proceeds in a ECR-plasma. The generating of such ECR-plasma discharges with a microwave coupling is relatively costly and is difficult to realize specifically for large area applications. In case of high demands made at the homogenity of the distribution of the removal, this method is specifically intrinsic and the realization in case of very large dimensions, if possible at all, poses large problems.

SUMMARY OF THE INVENTION

Hence, it is a general object of the present invention to provide a method which does away with the drawbacks of the prior art removing methods of etching methods.

A further object is to provide a method which can be executed in a simple manner and can achieve high rates of removal and operate specifically economically.

Still a further object is to provide a method in which the activation proceeds by means of a low voltage arc discharge by a hot emitting electrode and a cathode chamber which is structured as a pressure step.

A hot emitting electrode which is located in a cathode chamber emits electrons. A low voltage arc discharge is maintained between this hot cathode and the vacuum chamber in that an inert gas is fed into the cathode chamber as a carrier gas for the plasma discharge. The cathode chamber is in communication with the vacuum chamber via an opening having a diameter of a few millimeters, such that the discharge enters the vacuum chamber together with the gas flow. In order to control the propagation of the plasma discharge the cathode chamber can selectively be insulated from the vacuum chamber or be electrically connected to the vacuum chamber via a resistor or can be operated at the same potential as the vacuum chamber switched as anode. The mode of operation according to which the cathode chamber is electrically coupled in part to the vacuum chamber via a resistance and the vacuum chamber operates preferably as anode for the plasma discharge is the preferred mode. Similar conditions can also be arrived at if the cathode chamber is electrically connected to the vacuum chamber, whereby, however, the inner surface of the cathode chamber is covered by an electrode and latter is connected to the vacuum chamber via a resistor. For the plasma discharge it is preferred to feed a heavy inert gas such as argon or neon into the cathode chamber. The hydrogen gas which is responsible for the removing process is either led into the cathode chamber or can, however, be also led directly into the vacuum chamber The hydrogen which has been led in is excited by the plasma discharge in such a manner that the surfaces which are acted upon by the gas are eroded and the gaseous eroded or removed, products are led away by the vacuum pumping system. It is also possible to feed the hydrogen gas selectively combined into the vacuum chamber and into the cathode chamber. Depending on the mode of operation it is for instance possible to correspondingly prolong the useful lifetime of the hot emitting cathode at high cathode outputs by selecting of the suitable settings of the gas conditions, or to optimize the effect of the process.

Materials to be removed are such materials which are sensitive to the hydrogen reaction The method is specifically suitable for the removal of thin oxide layers of semiconductor materials such as for instance of the III/V semiconductors of the periodic system of the elements, such as for instance gallium arsenide. The method is specifically suitable for a removing of the oxides of silicon. In addition, the method can also be used to remove boron and sulfur and their compounds.

The unwanted contamination with boron and sulfur can, for instance, bias the functional characteristics of semiconductors. The method corrects such unwanted contaminations. In these applications highest demands are made regarding purity or contamination by a re-coating and further additions of foreign materials must be avoided. At such applications it is as a rule necessary to also avoid structural defects which can be produced by the bombardment by high energy particles. The method allows, furthermore, for treatment at low temperatures. The inventive application of a low voltage arc discharge for the method allows in a very simple manner an effective excitation or activation of the hydrogen gas. The low voltage arc discharge can activate, at high discharge currents and low discharge voltages, large amounts of hydrogen gas which leads to a high rate of and accordingly to high economics of the method and simultaneously a high purity of the method and little stressing of the materials being treated. Furthermore, the necessary operating values can be adjusted and set in a simple manner. The low voltage arc discharge is thus operated at a vacuum chamber total pressure in the range from about $1.10^{-4}$ to about 10 mbar and at discharge currents up to about 400 A and discharge voltages up to about 150 V. By means of a corresponding selection of the dimensions of the cathode chamber with its opening towards the vacuum chamber it is possible to set an operation pressure in the vacuum chamber in the range of about $1 \times 10^{-4}$ to 10 millibars. The total pressure in the cathode chamber can thereby amount to one or two powers of ten higher than in the vacuum chamber without any further ado. Typical values for the operating range are for instance discharge currents of about 10 amps and discharge voltages of about 10 to 30 volts at an operating pressure in the vacuum chamber of $1 \times 10^{-3}$ millibars. In case of an operating pressure of 1 millibar it is possible to for instance operate with process values with discharge currents of 100 amperes at a discharge voltage of about 10 to 20 volts. Depending on the selection of the pressure and of the dimensions of the chamber it is possible to vary the values in accordance with the prevailing demands. In case of arc current values set to be more than 100 amperes up to several 100 amperes it is for instance possible to quite easyly arrive at removal rates of more than one angström Å per second which allows an extremely economic operation on large areas because as a rule it is necessary to remove for a cleaning operation only layers of a thickness of a magnitude of about 100 angström. There are all the known options how to treat the substrates, as is usual with plasma processes they can either be laid on a mass potential, or they can be laid on a given voltage or even be insulated and thus work on a floating potential.

When coating workpieces with extremely pure coatings it, as a general rule is necessary to initially remove the surfaces of the workpiece prior to the coating operation by a cleaning operation in order to be able to reproducebly control the strength of the adherance and possibly the electrical contact properties between the layer and the substrate. In such a case it is advantageous to carry out the coating utilizing a coating source in the same vacuum chamber as the cleaning operation immediately and after the cleaning operation. For this task generally known sources can be used such as atomizing sources, vaporization sources, ion plating sources or CVD-gas sources, whereby it is also possible to use these sources in a combined manner. It is also possible, however, to proceed with the coating operation in separate vacuum chambers and to transport the workpiece to be coated from the cleaning chamber into the coating chamber. In case of such a procedure it is important that as little time as possible is lost between the cleaning step and the vapor deposition step and that the vacuum is maintained such that no re-contamination of the surfaces occurs during the time span therebetween. In certain cases it may be of advantage to operate after the removing step for a subsequent coating simultaneously the cathode chamber in order to support the coating procedure. It may be for instance desired to operate at coating processes with charge carriers in order to achieve certain effects For this task the cathode chamber with the correspondingly guided plasma discharge may be used in order to provide charge carriers such as electrons and ions. This apparatus is specifically suitable when certain gases are to be reactively built into the coating operation.

The proposed method has the advantage that the removing effect in the vacuum chamber is not limited to specific zones but acts over large areas. This facilitates the meeting of high demands made on the homogenity of the removal. Furthermore, it is possible to treat large areas simultaneously such that great economy is realized. It is, for instance, possible to quite easyly treat at the same time several workpieces or to place them on moveable supports such as is common in the case of workpiece supports used for coating. Due to the large area effect of the method it also can be used to clean simultaneously or also alone, a contaminated vacuum chamber inner wall and parts located therein. This is quite important if in case of extremely high purity applications also accordingly good vacuum conditions are demanded. By means of the method it is possible to clean a vacuum chamber prior to the vacuum processes.

BRIEF DESCRIPTION OF THE DRAWING

The invention will be better understood and objects other than those set forth above will become apparent when consideration is given to the following detailed description. Such description makes reference to the annexed drawing wherein the single figure illustrates schematically and in section an arrangement of a vacuum chamber and of a cathode chamber.

DESCRIPTION OF THE PREFERRED EMBODIMENT

A cathode chamber 2 is flanged via an insulator 20 onto the vacuum chamber 1. The vacuum chamber 1 is evacuated via a pumping unit comprising a pump 16 and valve 17. The process gas hydrogen can if needed be fed into the vacuum chamber via a gas inlet unit 14, 15. If it is foreseen to produce a coating following the cleaning procedure in the same chamber, it is for instance possible to arrange additionally one or a plurality of coating sources 18 A workpiece support 4 for the receipt of workpieces 3 to be cleaned is foreseen in the vacuum chamber Because the cleaning process involves the entire inner space of the vacuum chamber 1 it is possible to arrange the workpieces as that they are distributed over the entire vacuum space, this means for instance offset relative to the cathode chamber arrangement such as schematically illustrated by means of the supporting device 4a. The cathode chamber 2 of which the dimensions of the inner space are of the magnitude of centimeters, is open towards the vacuum chamber 1 by means of an opening 19 having a diameter of a few millimeters. A hot emitting cathode 5 is arranged in the cathode chamber 2 and consists for instance of a helical wire or corresponds to another common design of a thermal ion cathode. The emitting cathode 5 is supplied by an alternating current or direct current supply 8 in such a manner that the cathode reaches the emitting temperature. For the low voltage arc discharge a direct current supply 9 is switched in between the emitting cathode and the vacuum chamber which for instance depending from the position of the switch 21 acts as anode. In order to generate the low voltage discharge a carrier gas such as an inert gas, for instance argon, is fed via the gas inlet unit 10, 11 directly into the cathode chamber 2. The process gas hydrogen can selectively be fed in via the gas inlet unit 12, 13. The ignition of the low voltage arc discharge can proceed for instance by aid of an auxiliary electrode 6 which is connected via a resistor 7 to ground or to the vacuum chamber The propagation of the plasma discharge can be influenced in accordance with the switched connection at the anode side such as is made possible by the schematically illustrated selector switch 21. If the cathode chamber is directly electrically connected to the vacuum chamber, the cathode chamber operates itself preferably as anode, such that the plasma discharge remains substantially concentrated in the cathode chamber. If the cathode chamber is not connected to the vacuum chamber, that is if it is at a floating potential, the vacuum chamber operates as anode for the discharge, such that a corresponding passage of the plasma discharge into the vacuum chamber occurs. According to a preferred embodiment a resistor 22 of for instance 22 ohms is switched in between the vacuum chamber and the cathode chamber by means of which the effect of the plasma discharge between the cathode and vacuum chamber can be set in a suitable manner.

The described inventive arrangement for practicing the method allows a very simple design and the setting of high rates of removal which is advantageous regarding the overall economics of the method.

EXAMPLES

The illustrated examples disclose typical operation values for the setting of the low voltage arc discharge using argon gas in the cathode chamber for maintaining the gas discharge. Depending on the design, cathode helices are used which are operated for instance at a few 10 amps up to more than 150 amps heating current. The hereto necessary values are set by the dimensions of the cathode for which a certain emitting current or arc current is required. At the indicated exemplary settings the process gas hydrogen is fed into the cathode chamber. The vacuum chamber was evacuated by a pumping unit at a suction rate of 130 1/s. Higher suction rates broaden the operating range to lower vacuum chamber pressures down to the $10^{-4}$ mbar range.

| Example | 1 | 2 | 3 |
| --- | --- | --- | --- |
| Ar-flow (sccm) | 6 | 6 | 95 |
| H-flow (sccm) | 14 | 30 | 60 |
| discharge current (A) | 10 | 100 | 30 |
| discharge voltage (V) | 40 | 50 | 55 |
| total pressure (mbar) (in vacuum chamber) | $5 \times 10^{-3}$ | $1 \times 10^{-2}$ | $4 \times 10^{-1}$ |
| etching rate (A/sec) ($SiO_2$ thermal) | 0.05 | 0.8 | 0.1 | where sccm is standard cubic centimeters. The disclosed operation figures allow easyly a useful life time of the cathode of 150 hours and more. The method can be practiced at a low expenditure regarding apparatuses at high demands regarding purity and high rates of removal by means of which a production process is made possibly which is very economical.

The inert gas, preferably argon or neon, may be admitted into the cathode chamber for the low voltage discharge and hydrogen gas may be admitted into the vacuum chamber and/or into the cathode chamber. The material to be removed may be a material of a layer such as silicon dioxide and/or iron oxides and/or oxides of group III/V semiconductors and/or carbon compounds and/or carbon and/or boron and/or sulfur.

The low voltage discharge can be operated at a vacuum chamber total pressure in the range from about $1.10^{-4}$ to about 10 mbar and in which discharge currents up to about 400 A and discharge voltage up to about 150 V are applied.

Subsequent to the cleaning step, the cathode chamber can be used for supporting a coating operation, preferably a reactive coating operation, where the source may be a sputtering source and/or a vaporization or evaporation source and/or an ion plating source and/or a CVD-gas source.

While there is shown and described a present preferred embodiment of the invention, it is to be distinctly understood that the invention is not limited thereto, but may be otherwise variously embodied and practiced within the scope of the following claims.

We claim:

1. A method of removing material from a surface in a vacuum chamber, comprising:
   admitting inert gas into a contaminant-free cathode chamber for use in striking a low-voltage arc;
   striking a low-voltage arc for generating a plasma in the contaminant-free cathode chamber, using a hot emitting electrode in the cathode chamber, the cathode chamber communicating with the vacuum chamber and the plasma extending into the vacuum chamber;
   supplying hydrogen gas into at least one of the vacuum chamber and the cathode chamber so that hydrogen is provided in the vacuum chamber; and
   plasma-activating the hydrogen in the vacuum chamber using the low voltage arc and plasma from the cathode chamber, to remove material from a surface in the vacuum chamber.

2. A method according to claim 1, wherein the inert gas is selected from the group consisting of argon and neon.

3. A method according to claim 2, including admitting the hydrogen into the cathode chamber, the cathode chamber communicating with the vacuum chamber through an opening for passage of the plasma from the low voltage arc, from the cathode chamber into the vacuum chamber.

4. A method according to claim 1, wherein the material removed from the surface is selected from the group including silicon dioxide, iron oxides, oxides of group III/V semiconductor materials from the periodic table, carbon compounds, carbon, boron and sulfur.

5. A method according to claim 1, including establishing a total pressure in the vacuum chamber of between about $1.10^{-4}$ to about 10 mbar, and striking the low voltage arc by applying a discharge current of up to 400 A and a discharge voltage of up to 150 V to the hot emitting electrode.

6. A method according to claim 5, including providing a coating source and workpiece in the vacuum chamber to be coated with material from the coating source, and subsequent to removing the material from a surface in the vacuum chamber, using the cathode chamber for supporting a coating operation in conjunction with the coating source and workpiece.

7. A method according to claim 1, including dimensioning the vacuum chamber and cathode chamber for removing material from additional surfaces in the vacuum chamber.

8. A method according to claim 1, including removing material from a surface in the vacuum chamber to clean the surface, the low voltage arc discharge being formed during a pressure differential between the cathode chamber being structured to establish the pressure differential, and the vacuum chamber.

9. An apparatus for removing material from a surface in a vacuum chamber, comprising:

vacuum pumping means connected to the vacuum chamber for removing gas from the vacuum chamber;

means defining a cathode chamber having an opening communicating with the vacuum chamber;

a built-in thermo-emitting electrode in the cathode chamber;

first gas inlet means for supplying an inert gas to the cathode chamber;

a first power supply connected to the emitting electrode for heating the emitting electrode to emitting temperatures;

a second power supply connected to the cathode chamber and to the emitting electrode for producing a low-voltage arc discharge and plasma in the cathode chamber, the second power supply having a polarity so that the plasma in the low-voltage arc extends into the vacuum chamber through the opening; and at least one second gas inlet means for supplying hydrogen into at least one of the cathode chamber and vacuum chamber so that hydrogen is provided in the vacuum chamber, and so that activation of said second power supply produces the low-voltage arc discharge in the cathode chamber, with plasma which extends to the vacuum chamber forming plasma-activated hydrogen in the vacuum chamber for removing material from a surface of the vacuum chamber.

10. An apparatus according to claim 9, including at least one workpiece support mounted in the vacuum chamber for carrying at least one workpiece at an offset location with respect to the opening between the cathode chamber and the vacuum chamber.

11. An apparatus according to claim 9, including a coating source in the vacuum chamber for coating a workpiece in the vacuum chamber.

12. An apparatus according to claim 11, wherein the coating source comprises at least one of a sputtering source, an evaporation source, an ion plating source, and a CVD-gas source.

13. An apparatus according to claim 9, wherein the cathode chamber is mechanically connected to and electrically insulated from the vacuum chamber, said second power supply including a switch for electric connection between the cathode chamber and the vacuum chamber for causing at least one of the vacuum and cathode chambers to form an anode with respect to the emitter electrode which forms a cathode for the low voltage arc discharge.

14. An apparatus according to claim 13, including an auxiliary electrode in the cathode chamber for enhancing the low voltage arc discharge.

* * * * *